(12) United States Patent
Krahn et al.

(10) Patent No.: US 12,146,929 B2
(45) Date of Patent: Nov. 19, 2024

(54) FASTENING AN NMR PROBE HEAD TO THE SHIM TUBE END OF THE NMR MAGNET WITH AUTOMATABLE FUNCTIONAL CONNECTIONS

(71) Applicant: Bruker BioSpin GmbH, Ettlingen (DE)

(72) Inventors: Alexander Krahn, Karlsruhe (DE); David Osen, Ettlingen (DE); Priyanga Bandara, Karlsruhe (DE); Jürgen Ganz, Ettlingen (DE)

( * ) Notice: Subject to any disclaimer, the term of this patent is extended or adjusted under 35 U.S.C. 154(b) by 27 days.

(21) Appl. No.: 18/066,381

(22) Filed: Dec. 15, 2022

(65) Prior Publication Data

US 2023/0184854 A1    Jun. 15, 2023

(30) Foreign Application Priority Data

Dec. 15, 2021    (DE) .................. 10 2021 214 453.5

(51) Int. Cl.
*G01R 33/30*    (2006.01)
*G01R 33/31*    (2006.01)

(52) U.S. Cl.
CPC .......... *G01R 33/307* (2013.01); *G01R 33/31* (2013.01)

(58) Field of Classification Search
CPC ...... G01R 33/307; G01R 33/31; G01R 33/36; G01R 33/34007; G01R 33/30; G01N 24/08
See application file for complete search history.

(56) References Cited

U.S. PATENT DOCUMENTS

| 6,204,665 B1 | 3/2001 | Triebe et al. |
| 6,677,751 B1 * | 1/2004 | Marek .................... G01R 33/30 324/318 |
| 7,408,353 B1 | 8/2008 | Marek et al. |

(Continued)

FOREIGN PATENT DOCUMENTS

| DE | 197 44 763 A1 | 5/1999 |
| DE | 10 2006 020 774 B3 | 2/2008 |

(Continued)

OTHER PUBLICATIONS

Harting "Interface und Industrie Steckverbinder Neuheiten", Developmentscout Online Magazine, 2021, [retrieved Aug. 7, 2022].

(Continued)

*Primary Examiner* — G. M. A Hyder
(74) *Attorney, Agent, or Firm* — Benoît & Côté Inc.

(57) ABSTRACT

An apparatus for detachably fastening an NMR probe head with a pedestal box to an NMR magnet system of an NMR spectrometer has a holding system rigidly connected to the magnet system. A base plate of the holding system fastens detachably to the probe head pedestal box. A receiving device on or in the base plate receives all electric, electronic, optical, pneumatic, and thermal feed lines and optionally discharge lines required for the operation of the probe head. A lower side of the base plate in contact with an upper side of the pedestal box comprises multiple connecting elements into which the feed lines and discharge lines merge. The upper side of the pedestal box comprises receiving elements into which the feed lines and discharge lines from the connecting elements merge in a predetermined relative assembled position.

16 Claims, 5 Drawing Sheets

(56) References Cited

U.S. PATENT DOCUMENTS

| | | |
|---|---|---|
| 9,110,132 B2 | 8/2015 | Chiodo |
| 10,379,179 B2 | 8/2019 | Meister et al. |
| 2009/0015259 A1 | 1/2009 | Courtney |
| 2022/0373622 A1 | 11/2022 | Mayer et al. |

FOREIGN PATENT DOCUMENTS

| | | |
|---|---|---|
| DE | 10 2017 215 763 B3 | 12/2018 |
| DE | 10 2021 205 192 A1 | 11/2022 |

OTHER PUBLICATIONS

Bruker, "NMR Instruments Probes", 2021.
Odu Mac, "Non-magnetic Connector solutions for MRI applications", Brochure, 2021.

* cited by examiner

FASTENING AN NMR PROBE HEAD TO THE SHIM TUBE END OF THE NMR MAGNET WITH AUTOMATABLE FUNCTIONAL CONNECTIONS

BACKGROUND OF THE INVENTION

Field of the Invention

The invention relates to a fastening apparatus for detachably fastening an NMR probe head with a pedestal box to an NMR magnet system of an NMR spectrometer having a room temperature tube in which a holding system rigidly connected to the magnet system is arranged at least during the operation of the NMR spectrometer, said holding system being part of the fastening apparatus and comprising a base plate, to which the NMR probe head is detachably mechanically fastenable by way of its pedestal box. Such a fastening apparatus has been disclosed in patent document DE 10 2017 215 763 B3.

Description of the Related Art

The present invention relates very generally to the field of NMR (nuclear magnetic resonance) spectrometers and more particularly to fastening apparatuses for detachably fastening an NMR probe head to an NMR magnet system of an NMR spectrometer. In this context, the NMR magnet system usually consists of a magnet with a central bore and a shim system for field correction situated therein. Moreover, the shim system is the mechanical interface to the NMR probe head, within which the NMR sample is measured.

To connect an NMR probe head to the control units ("console") of an NMR spectrometer, it is generally necessary to establish numerous electrical, pneumatic, and optical connections between the NMR probe head and the spectrometer console. In so doing, there may be numerous instances of a user of the NMR spectrometer mixing up the individual channels of the various connections and connecting these to one another incorrectly. This may result in a malfunction of the NMR spectrometer or of the NMR probe head, right up to the destruction of individual system components. Moreover, the hardware of the NMR spectrometer is only able to carry out a connectivity test for all connections with a great amount of outlay.

DE 10 2017 215 763 B3, cited at the outset, describes a mechanical fastening apparatus for an NMR probe head at the shim system or at the magnet. The fastening apparatus comprises a disk-shaped insert part with a spring element. The NMR probe head is fastened to the insert part by means of a plurality of holding elements. The fastening apparatus allows the user to manually reliably frictionally fix the NMR probe head at the lower side of the magnet system by way of a rotary movement of the insert part. However, this reference does not describe that the fastening apparatus provides for closure of the connections, for instance electric, pneumatic or optical connections, required for the NMR measurements.

DE 10 2006 020 774 B3 describes an NMR probe head in which the receiver coils are cryogenically cooled. From the receiver coils, cooling lines are guided within the NMR probe head to a coupling apparatus for the cooling lines. From the coupling apparatus, further cooling lines then lead to an external cryocooler. Furthermore, a separate RF (radiofrequency) line leads from the NMR probe head to a coupling apparatus for the RF line.

The main problem with cryogenically cooled NMR probe heads lies in reliably connecting the cooling lines with the coolant to the external cryocooler. In DE 10 2006 020 774 B3, the coupling apparatus for the cooling lines and the coupling apparatus for the RF line are embodied separately from one another. To ensure the full functionality of the NMR probe head and in order to avoid malfunctions and possible defects of the NMR spectrometer, the coupling apparatuses must each be connected by expert staff.

US 2009/0015259 A1 discloses an NMR spectrometer with a cryostat having a bore. The cryostat comprises an end cover, which may be a flat (substantially plane) disk-shaped plate, for example a cryostat base plate. An assembly bridge extends across the central bore. A shim coil arrangement (shim tube) and an NMR probe (NMR probe head) are rigidly fastened to the assembly bridge by way of a set of fastening elements. The assembly bridge serves to precisely assemble the shim coil arrangement and the NMR probe head centrally in the bore.

However, there is no detailed discussion as to whether the connections, such as electric, pneumatic, and optical connections, required for the operation of the NMR spectrometer run via the shim tube to the probe head.

U.S. Pat. No. 9,110,132 B2 discloses an animal bed for preclinical MRI (magnetic resonance imaging). The animal bed comprises, inter alia, surface coils for performing the MRI scan and a connection system for fluid and electrical connections. Coolant for the surface coils, heat liquid for a sample, anesthetic gas and/or compressed air and other gases can be fed and/or discharged via one or more lines.

The various connectors are brought together manually in a plug/jack system. Checking the closed connections is likewise implemented manually. However, the connectors can be mixed up and connected incorrectly in the process. This may result in a malfunction of the animal bed, right up to the destruction of individual system components.

SUMMARY OF THE INVENTION

In comparison with the prior art, the present invention is based on the object of providing a standardized fastening apparatus for an NMR spectrometer, which is able to reliably connect all lines required for the operation of the NMR probe head in one step with the components of the NMR spectrometer. Furthermore, the intention is to propose an NMR spectrometer having such an easily automatable fastening apparatus.

This object is achieved by the present invention in a manner that is as surprisingly simple as it is effective, by virtue of the fact that a receiving device is present on or in the base plate of the magnet system or on a holding system arranged thereon, all electric, electronic, optical, pneumatic, and thermal feed lines and optionally discharge lines required for the operation of the NMR probe head in the NMR magnet system arriving in said receiving device, the fact that the base plate, at its lower side which is in contact with an upper side of the pedestal box of the NMR probe head during the operation of the NMR spectrometer, comprises a multiplicity of connecting elements, into which all feed lines and optionally discharge lines from the receiving device merge, and the fact that the pedestal box of the NMR probe head comprises receiving elements on its upper side, into which receiving elements all feed lines and optionally discharge lines from the connecting elements merge exactly in a relative assembled position, which is defined for the operation of the NMR spectrometer, of the holding system and NMR probe head.

Thus, the present invention proposes to allow all electric, electronic, optical, pneumatic, and thermal feed lines and optionally discharge lines (subsumed below by the collective term lines) required for the operation of the NMR probe head in the NMR magnet system to arrive collectedly into the base plate and to provide connecting elements and receiving elements such that a user only still needs to insert the NMR probe head into the holding system, which is connected to the NMR magnet system, and all connections between the NMR probe head and the holding system are closed automatically during the insertion.

To this end, the different lines are all introduced into the base plate of the magnet system (holding system) by way of a receiving device. Thus, the lines altogether converge at the receiving device and are led into the base plate via said receiving device. Since, according to the invention, the base plate only comprises one receiving device, it is possible to prevent a clutter of lines which are inserted into the base plate at different positions. This can simplify the structure and the available space can be used efficiently.

The various lines are guided in the base plate to a lower side of the base plate, which is opposite to an upper side of the pedestal box of the NMR probe head. The connecting elements (e.g., plugs), into which the various lines merge, are located at the lower side of the base plate. Thus, the various lines are guided and arranged at a predefined position. Accordingly, the user of the NMR spectrometer is unburdened of the task of assigning and arranging the different lines according to their functions.

Receiving elements, for example sockets, are found on the upper side of the pedestal box. The receiving elements of the pedestal box and connecting elements in the base plate are aligned relative to one another in such a way that the various lines which are guided to the connecting elements exactly coincide with and merge into the receiving elements. The relative position of the receiving elements and connecting elements is thus standardized in such a way that these reliably meet as a result of a relative assembled position, which is defined for the operation of the NMR spectrometer, of the holding system and the NMR probe head. The NMR probe head and the NMR magnet system with their various lines can thus be easily connected to one another in automated fashion in particular.

Hence, the user is unburdened of a laborious connection of the various lines between the NMR probe head and the NMR spectrometer console, and a protracted verification as to whether the various lines between NMR probe head and NMR spectrometer console are correctly connected is no longer required. All connections between the NMR probe head and the NMR spectrometer console required for operation can be closed correctly, without a further intervention by the user, and in one step as a result of introducing the NMR probe head into an opening in the holding system provided to this end, and the NMR probe head can be fastened. This can prevent a mix-up of the connections and a malfunction of or damage to the NMR spectrometer and its components accompanying this. Furthermore, this allows even a user of NMR spectrometers with average training (a technical assistant, for example) to easily connect the NMR probe head to the NMR spectrometer console.

As a result of standardizing the receiving elements and connecting elements, the NMR probe head can be provided with a standardized pedestal box. Then, all connections desired by the user can be installed in the receiving elements on the upper side of the NMR probe head.

Typically, use can be made of the following receiving elements for the NMR probe head, which is connected to the NMR spectrometer, and the following connecting elements for the base plate:

Radiofrequency connections with a frequency range of 0-2 GHz, an insulation←−80 dB, an impedance of 50 ohms, for example, and an impedance variation<5%.

Self-locking pneumatic plugs with a diameter≥3 mm and a pressure range of 0-8 bar.

Heater plugs with $I_{max}$≥10 A and two lines with shielding.

Thermocouple plugs with two lines with shielding.

VT (=variable temperature) channels, for example designed according to the Johnston coupler principle, with a contact pressure>10 N and $P_{max}$≥8 bar, through which $N_2$ is guided at temperatures from −50° C. to 300° C.

Data plugs with a shielding with insulation>20 dB and three to nine lines.

Optical plugs with an axial contact force>5 N and an axial alignment.

In a preferred class of embodiments of the fastening apparatus according to the invention, provision is made for the connecting elements and the receiving elements to be in the form of geometrically exact plug/socket pairs.

As a result, the connecting elements and receiving elements can easily be connected and separated. The connecting elements and receiving elements are suitably aligned by form fit. Furthermore, this can further reduce the probability of the feed lines and optionally discharge lines, which are guided through the connecting elements and receiving elements, kinking. Likewise, the feed lines and optionally discharge lines can easily be protected from influences from the environment by way of the plug/socket pairs.

Likewise advantageous are embodiments of the fastening apparatus according to the invention, in which the connecting elements and the receiving elements are configured such that, following the installation of the NMR probe head in its operational position within the NMR magnet system, all electric, electronic, mechanical, optical, pneumatic, and thermal connections required for the operation of the NMR probe head in the NMR magnet system are through-connected.

A protracted setup of the connections by the user can thus be dispensed with. As a result, the NMR spectrometer can immediately be put into operation and long waiting times for the NMR spectrometer to become ready for use are dispensed with.

Likewise preferred are embodiments which are characterized in that all electric, electronic, optical, pneumatic, and thermal feed lines which are required for the operation of the NMR probe head in the NMR spectrometer and which arrive in the receiving device of the base plate of the holding system are guided from an NMR spectrometer console to the holding system by means of a single conductor bundle and in that the conductor bundle is preferably surrounded by an external RF shield.

The feed lines thus arrive collectedly in the base plate of the holding system via the receiving device. This can prevent a cluster of feed lines, and the spatial requirements in the direct vicinity of the NMR spectrometer console can be reduced. Furthermore, this can reduce the risk of a user tripping over individual inlet lines leading away from the NMR spectrometer console, and injuring themselves or damaging adjacent technical equipment in the process. The external RF shield can prevent interference signals from being input coupled into or output coupled from the conductor bundle.

Moreover preferred are embodiments of the fastening apparatus according to the invention, in which a locking device is present to prevent an inadvertent detachment of the connecting elements from the receiving elements, which locking device can preferably be triggered manually by one hand or automatically, more particularly electrically or pneumatically, in order to replace the NMR probe head.

As a result of the locking device, the connecting elements and receiving elements can be reliably and securely interconnected. The one-hand manual or automatic trigger of the locking device allowed thereby is particularly convenient for the user. By way of example, the remaining hand or remaining hands can be used to secure the NMR probe head during the replacement of said NMR probe head.

Further preferred embodiments are characterized in that a positioning device is present, the latter mechanically guiding and/or aligning the NMR probe head during its assembly into its operational position within the magnet system, in such a way that the receiving elements of the NMR probe head are necessarily steered directly to the opposing connecting elements of the holding system corresponding therewith when the upper side of the pedestal box is brought into contact with the lower side of the base plate.

This allows particularly precise and secure bringing together of the NMR probe head and the magnet system. This minimizes the possibility of incorrect assembly by a user.

In advantageous developments of this embodiment, provision is made for the positioning device to be configured in such a way that it allows only one possible orientation of the NMR probe head in the NMR magnet system so that the NMR probe head cannot tilt within the NMR magnet system.

The possibilities of incorrect assembly and the damage to the NMR probe head or the NMR magnet system by a user caused thereby can be virtually excluded in this way. By way of example, the positioning device can be configured with guide aids or alignment pins, which are applied to the holding system and to the NMR probe head.

Very particularly preferred are a class of embodiments of the fastening apparatus according to the invention, in which provision is made of a drive apparatus, more particularly a motor, preferably an electric motor, or a pneumatic apparatus, which brings about automatable pressing of the upper side of the pedestal box against the lower side of the base plate and preferably also brings about locking.

This allows the receiving elements on the lower side of the base plate and the connecting elements on the upper side of the pedestal box to be reliably aligned and securely connected/locked with the required contact pressure. Thus, the lines between the NMR probe had and the NMR magnet system can be interconnected in automated fashion without the user having to exert a great amount of force. This can decisively simplify the operation of the NMR spectrometer by a user.

In advantageous developments of this class of embodiments, provision is furthermore made for the drive apparatus to be equipped with actuators which trigger a through-connection of the electric, electronic, optical, pneumatic, and thermal feed lines and optionally discharge lines as soon as the NMR probe head is introduced into its operational position within the magnet system and which open up the through-connection when the NMR probe head should be removed from the magnet system again, especially after an NMR measurement has been completed.

Closing and opening the connections by actuators is advantageous because the feed lines and optionally discharge lines can be through-connected or the through-connections can be opened by way of an electrical signal. Different types of actuators can be obtained cost-effectively from commercial vendors.

Likewise advantageous are developments of this class of embodiments, in which an electronic control device monitors the contact pressure between the upper side of the pedestal box and the lower side of the base plate by means of sensor elements and preferably adjusts said contact pressure to a specifiable target value.

The electronic control device allows the contact pressure to be adjusted in such a way that the connecting elements on the upper side of the pedestal box and the receiving elements on the lower side of the base plate are brought together optimally. This allows the lines running through the connecting elements and receiving elements to be closed optimally and allows full functionality of the NMR spectrometer to be achieved. Furthermore this allows a uniform contact pressure to be achieved—unlike what is normally the case with different users who have different body strengths—and a fault-free function of the individual components can be ensured over the entire planned service life of the probe head.

Also advantageous are variants of these developments, in which the electronic control device is configured so that it can carry out an electronic end position check of the connecting elements and/or of the receiving elements and can stop the drive apparatus when the desired end position is reached.

This allows a particularly precise alignment of the connecting elements and/or receiving elements in the desired end position. Furthermore, this can prevent malfunctions or wear as a result of too hard pressing together of the components.

Further advantageous developments are characterized in that the sensor elements comprise trailing contacts, which close one or more contacts when an end position has been reached in the translational direction and which consequently transmit the information that the end position has been reached and the drive will be stopped to an actuator. Preferably three trailing contacts are arranged distributed over the contact area between the upper side of the pedestal box and the lower side of the base plate in such a way that it is possible to ensure that all connections between holding system and NMR probe head are closed before the start of an NMR measurement.

The trailing contacts allow further automation of the fastening procedure between the NMR probe head and the base plate of the NMR magnet system, consequently designing this to be more reliable; in particular, a faulty operation of the NMR spectrometer that precedes the closure of all connections between the NMR probe head and the base plate, and hence the NMR spectrometer console, can be reliably prevented.

In further advantageous variants of these developments, the electronic control device outputs a warning notification to a user of the NMR spectrometer on account of the information from the end position check should the system identify a problem, in particular if the NMR probe head has not been correctly connected to the holding system.

Consequently, a user of the NMR spectrometer can easily be notified to not yet put the NMR spectrometer into operation. This can avoid possible damage to the NMR spectrometer and the components connected therewith. Thereupon, the user can, for example, correctly connect the NMR probe head to the holding system, as a rule manually in that case.

Also advantageous are embodiments of the fastening apparatus according to the invention, which are characterized in that a spring element is arranged between the base plate of the holding system and the pedestal box of the NMR probe head and said spring element is relaxed in a first, open state and loaded in such a way in a second, closed state that the connection between the base plate and pedestal box is mechanically loaded so that the connection is mechanically without play, in that engagement parts are preferably arranged on the probe head side, the engagement parts preferably engaging in the spring element on the holding system side, and in that in particular a radially movable insert part is provided, the latter being mechanically connected to the spring element and being able to be moved between the two states, for example with the aid of a motor with a worm drive.

Likewise advantageous are embodiments of the fastening apparatus according to the invention, in which a shim system for field-forming of the homogeneous magnetic field produced by the NMR magnet system is integrated in the holding system.

As a result of integrating the shim system into the holding system, it is possible to save space in the bore of the NMR spectrometer, as this is often in short supply. Again, the shim system need not be installed by way of dedicated connectors and the electrical conduction to the NMR spectrometer console then likewise runs via the conductor bundle to the receiving device of the base plate.

The scope of the present invention moreover includes an NMR spectrometer comprising an NMR spectrometer console and an NMR magnet system, which has a room temperature tube in which an NMR probe head with a pedestal box is detachably fastened. According to the invention, this NMR spectrometer is distinguished in that it comprises a fastening apparatus according to the invention of the above-described type.

Further advantages of the invention arise from the description and the drawing. Likewise, according to the invention, the aforementioned features and the features yet to be explained in more detail below may find use individually on their own in each case or together in any combination. The shown and described embodiments should not be construed as a comprehensive list, but rather have an exemplary character for explaining the invention.

BRIEF DESCRIPTION OF THE DRAWINGS

The invention is depicted in detail in the drawings and is explained more in depth on the basis of exemplary embodiments. In the drawings:

FIG. 4b shows a schematic detailed view of an alternative embodiment of the screwed connections from FIG. 4a.

DETAILED DESCRIPTION

Figure 1:
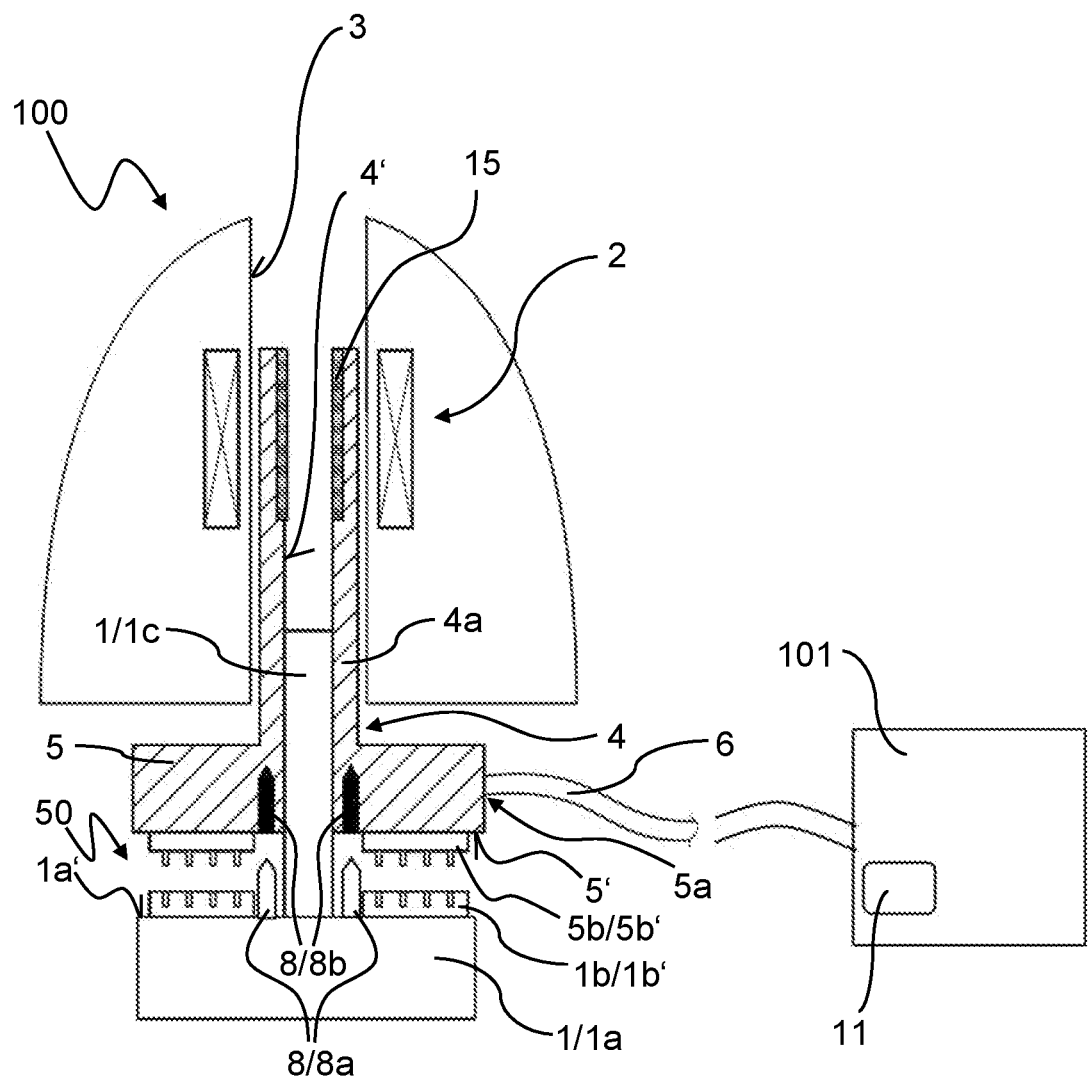
FIG. 1 shows a schematic longitudinal section through an NMR spectrometer with an exemplary first embodiment of the fastening apparatus according to the invention.

FIG. 1 shows a schematic longitudinal section of an NMR spectrometer 100 with an exemplary first embodiment of the fastening apparatus 50 according to the invention.

The NMR spectrometer 100 comprises an NMR magnet system 2 and a room temperature tube 3 ("room temperature bore"; "bore") and also an NMR spectrometer console 101. In the embodiment shown here, the NMR magnet system 2 has a half-ellipsoid form. The room temperature tube 3 is arranged substantially centrally in the NMR magnet system 2. Furthermore, the room temperature tube 3 has a cylindrical form here. A holding system 4 with an inner holding system bore 4' has been introduced into the room temperature tube 3. The holding system 4 is rigidly connected to the magnet system 2 during the operation of the NMR spectrometer 100. An NMR probe head 1 has been partially inserted into the holding system bore 4' of the holding system 4.

The holding system 4 is a part of the fastening apparatus 50 and in this case comprises a cylindrically formed neck region 4a and a cylindrically formed base plate 5. The holding system bore 4' is likewise formed cylindrically in this case.

The diameter of the base plate 4 is approximately four times the size of the diameter of the neck region 4a in the embodiment shown. In this case, approximately 85% of the neck region 4a has been inserted into the room temperature tube 3 of the NMR magnet system 2.

In the embodiment shown here, an only schematically indicated shim system 15 is furthermore integrated into the neck region 4a of the holding system 4. The shim system 15 serves for field-forming of the homogeneous magnetic field produced by the NMR magnet system 2. By integrating the shim system 15 into the holding system 4, it is firstly possible to efficiently use the installation space for components in the room temperature tube 3, as this space is typically restricted in NMR spectrometers. Furthermore, feed lines from the shim system 15 can be guided directly within the neck region 4a to the base plate 5.

A receiving apparatus 5a is present on the base plate 5. By way of the receiving apparatus 5a, electrical, electronic, optical, pneumatic, and thermal feed lines and discharge lines are received in the base plate 5. In the embodiment shown here, the various feed lines and discharge lines are combined in a single conductor bundle 6, which merges into the receiving apparatus 5a. In this way, the various lines can be guided centrally at one point into the base plate 5.

In the embodiment shown here, the NMR magnet system 2 is connected to the NMR spectrometer console 101 by way of the conductor bundle 6. The spectrometer console 101 comprises an electronic control device 11. The NMR spectrometer console 101 comprises the complete control for NMR data acquisition and spectroscopic evaluation of the NMR data, and the user interface. The computer-based operating system present in the NMR spectrometer console 101 also adopts complete control over the NMR channels and comprises a complete RF production, transmitter and receiver infrastructure. Temperature control and compressed air apparatuses are likewise controlled by way of the console. The sensors, which in the probe head for example detect the temperature or, in the case of MAS (magic-angle spinning) NMR, the rotational speed of the rotors, transmit the data to the NMR spectrometer console 101, where these data are acquirable by way of an interface and optionally also adjustable. Further functions of the electronic control device 11 can be gathered from FIGS. 2 and 3 and the associated description.

Further receiving apparatuses 5*a*, which possibly increase the construction outlay and the spatial requirements of the base plate 5, are therefore not mandatory. Moreover, all lines can be guided collectedly and in ordered fashion to the base plate 5 via the conductor bundle 6 and the workplace safety can be increased since now the multiplicity of lines are guided to the base plate 5 through only a single conductor bundle 6 and not individually, arranged scattered around the base plate 5 and the workspace. In this case, the conductor bundle 6 is surrounded by an RF shield—not depicted more closely in detail—which can be used to prevent radiofrequency interference signals from being input coupled into the conductor bundle 6.

In the base plate 5, the lines which are guided into the base plate 5 via the receiving apparatus 5*a* are guided on a lower side 5' of the base plate 5. The lower side 5' of the base plate 5 comprises a multiplicity of connecting elements 5*b*. Here, the connecting elements 5*b* are in the form of plugs 5*b*'. All lines in the base plate 5 are guided to the connecting elements 5*b*, where the lines merge into the connecting elements 5*b*. In the embodiment shown here, the lines which are guided from the shim system 15 into the base plate 5 via the neck region 4*a* are guided onward to the receiving apparatus 5*a*.

Here, the NMR probe head 1 comprises a cylindrically formed probe head neck 1*c* and a cylindrically formed pedestal box 1*a*. The diameter of the pedestal box 1*a* is approximately five times the size of the diameter of the probe head neck 1*c* in the embodiment shown here. In this case, approximately 60% of the probe head neck 1*c* has been inserted into the holding system bore 4'.

On an upper side 1*a*', the pedestal box 1*a* comprises a multiplicity of receiving elements 1*b*. Here, these are in the form of plug sockets 1*b*'. The assembled position of the holding system 4 and of the NMR probe head 1 is aligned so that the receiving elements 1*b* on the upper side 1*a*' of the pedestal box 1*a* exactly coincide with the connecting elements 5*b* on the lower side 5' of the base plate 5.

If the NMR probe head 1 is inserted fully into the holding system 4, the various lines which are guided into the connection elements 5*b* of the base plate 5 merge into the receiving elements 1*b* of the pedestal box 1*a*. The NMR probe head 1 then is in its operational position (not depicted in any more detail). The NMR probe head 1 is then detachably fastened to the magnet system 2 and can be put into operation. The connecting elements 5*b* and receiving elements 1*b* are brought together virtually automatically. Laborious connecting of the individual lines between the pedestal box 1*a* and the base plate 5, and errors when connecting the individual lines, can be dispensed with. Since all the components are already available at the correct position, the NMR probe head 1 merely has to be inserted into the holding system 4 with the correct alignment. This alignment can also be implemented in automated fashion.

Furthermore, a positioning device 8 is present in order to position and align the receiving elements 1*b* and connecting elements 5*b* more easily. By way of example, the positioning device 8 may consist of alignment pins 8*a*, which are formed on the pedestal box 1*a* of the NMR probe head 1 and which are inserted into receiving recesses 8*b* of the holding system 4. When bringing together the NMR probe head 1 and the holding system 4, more precisely when bringing together the upper side 1*a*' of the pedestal box 1*a* and the lower side 5' of the base plate, the receiving elements 1*b* and the connecting elements 5*b* are necessarily guided exactly to one another as a result of the guide aids. Typically, the positioning device 8 is designed so that the NMR probe head 1 and the holding system 4 can be brought together in only one possible orientation. In this way, there is only one possible relative orientation of the NMR probe head 1 and the NMR magnet system 2, as a result of which it is possible to practically exclude tilting of the NMR probe head 1 within the magnet system 2.

In a further embodiment which is not depicted in any more detail in the drawing, the fastening apparatus 50 may moreover comprise a locking apparatus. With the aid of the locking apparatus, it is possible to prevent an inadvertent detachment of the connecting elements 5*b* from the receiving elements 1*b*. To replace the NMR probe head 1, the locking device can be triggered automatically or manually using one hand. Automatic triggering can be implemented electrically or pneumatically, for example.

Figure 2:
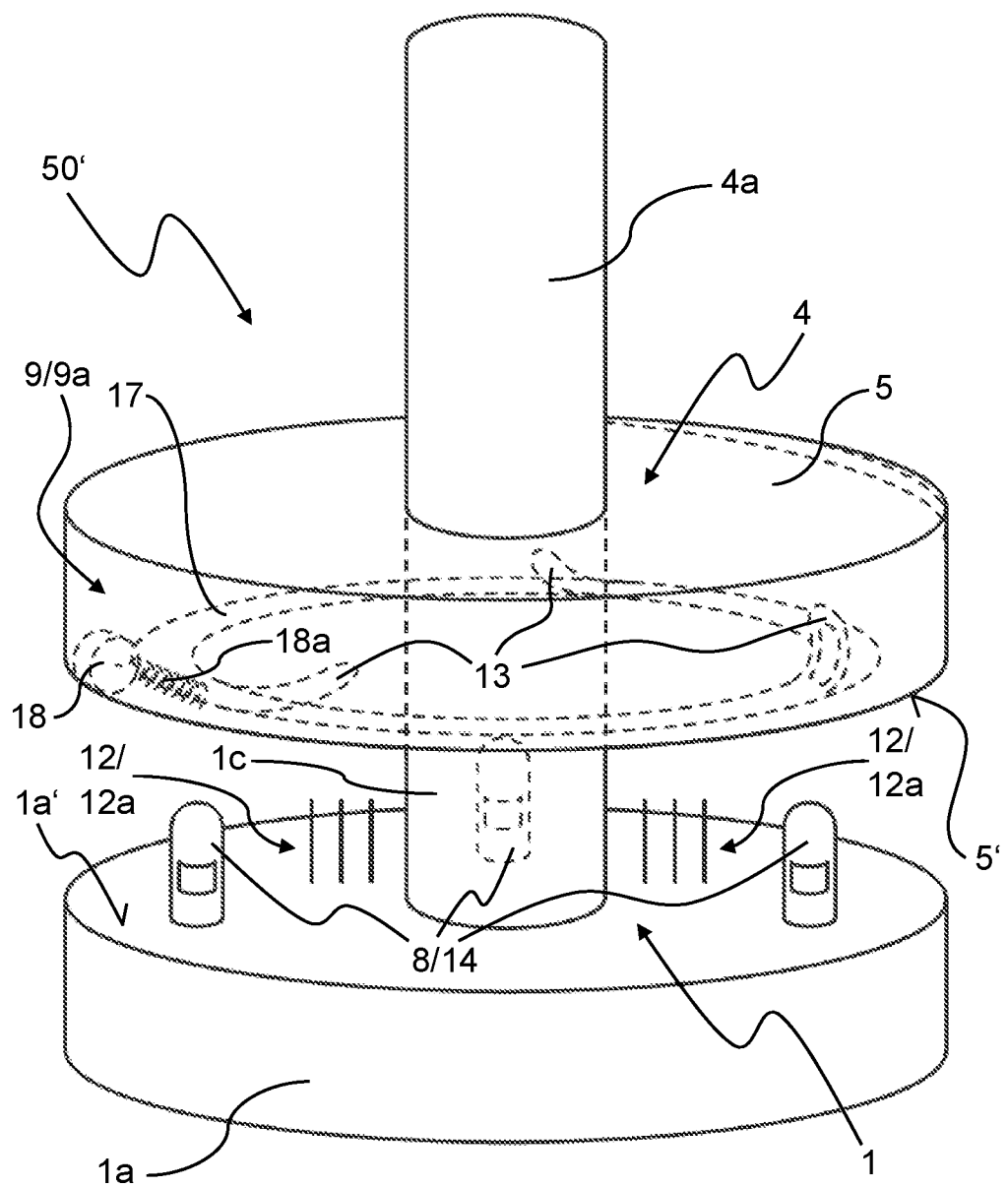
FIG. 2 shows a perspective view of a portion of an exemplary second embodiment of the fastening apparatus according to the invention with spring elements and engagement parts.

FIG. 2 shows a perspective view of a portion of an exemplary second embodiment of the fastening apparatus 50' according to the invention with a drive apparatus 9, formed here as a radial drive 9*a*. Depicted are the holding system 4 with a part of the neck region 4*a* and the base plate 5, and also the NMR probe head 1 with the pedestal box 1*a* and a part of the probe head neck 1*c*.

Sensor elements 12, embodied here in each case as three trailing contacts 12*a*, are attached to the upper side 1*a*' of the pedestal box 1*a*. Furthermore, the upper side 1*a*' of the pedestal box 1*a* comprises three engagement parts 14 arranged uniformly distributed around the perimeter of the pedestal box 1*a* in the embodiment shown here. In this embodiment, the engagement parts 14 with the exact receiving element (not shown) in the base plate 5 can form the positioning apparatus 8.

A radially movable insert part 17, which is connected to three spring elements 13 here, is integrated into the base plate 5. Furthermore, a motor 18, which is connected to a worm drive 18*a*, is installed in the base plate 5. The worm drive 18*a* engages in the radially movable insert part 17.

In the embodiment shown here, the spring elements 13 are relaxed in a first, open state. When the NMR probe head 1 is inserted into the holding system 4, the receiving elements are connected to the engagement parts 14 as connecting elements and the insert parts 17 engage in the spring elements 13 in the base plate 5. The spring elements 13 can then be loaded in a second, closed state. Then, a connection without mechanical play is present between the NMR probe head 1 and the base plate 5.

The radially movable insert part 17 can be moved between the first, open state and the second, closed state by way of the motor 18 with the worm drive 18*a*.

The sensor elements 12 are connected to the electronic control device 11 in the NMR spectrometer console 101. The electronic control device 11 allows the contact pressure between the upper side 1*a*' of the pedestal box 1*a* and the lower side 5' of the base plate 5 to be monitored by the sensor elements 12. Moreover, the electronic control device 11 allows the contact pressure to be adjusted to a specifiable target value.

Furthermore, the electronic control device 11 can be designed so that it electrically checks the end position of the connecting elements and receiving elements. If the desired end position then is reached, the electronic control device 11 can transmit a signal to the drive apparatus 9 to stop the current drive procedure and maintain the end position.

Should the check of the end position turn out negative, for example if the NMR probe head 1 and the holding system 4 have not been correctly interconnected, the electronic control device 11 can output a warning notification to the user of the NMR spectrometer. This can prevent an incorrect operation of and damage to the NMR spectrometer.

Figure 3:
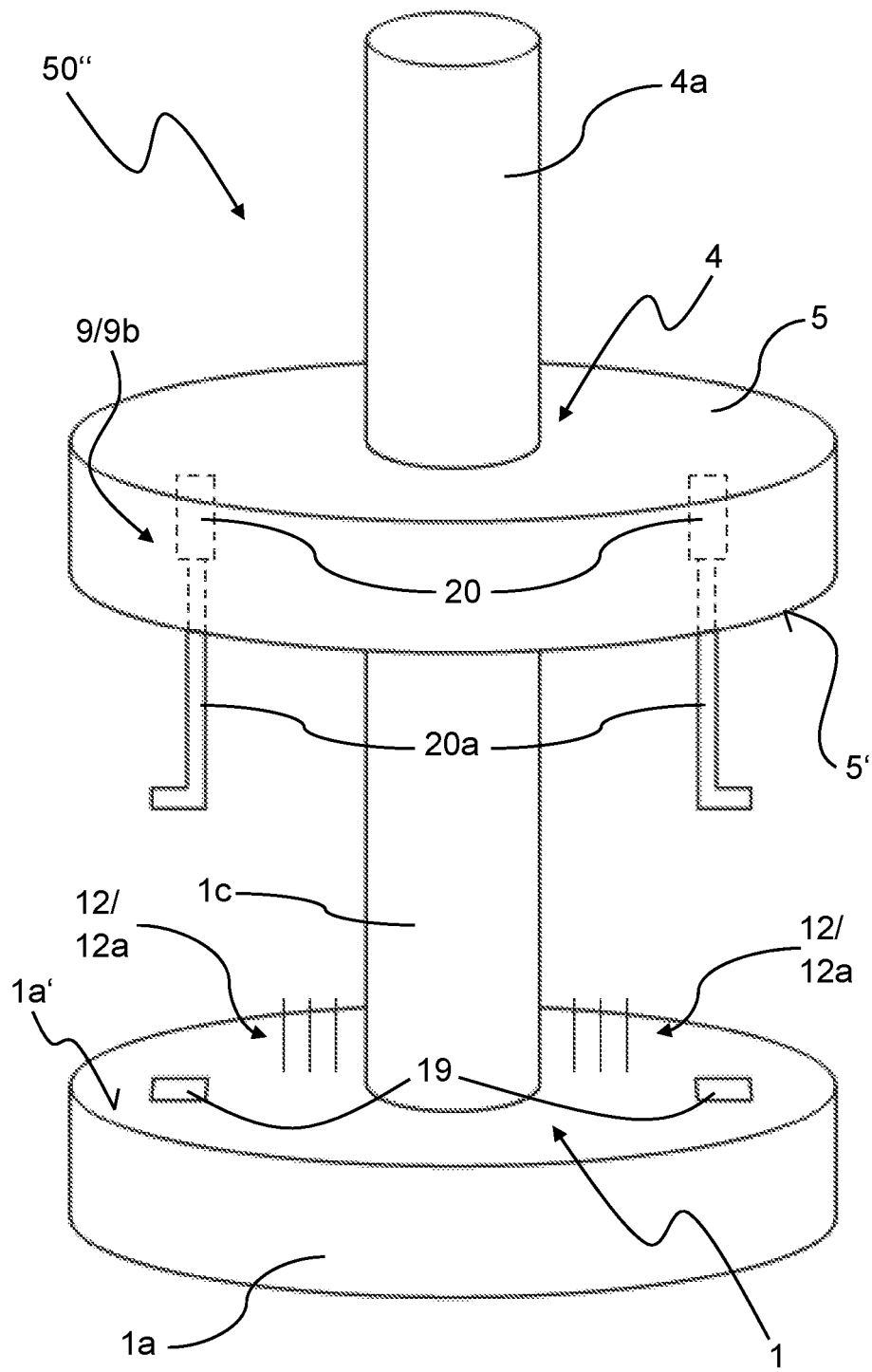
FIG. 3 shows a perspective view of a portion of an exemplary third embodiment of the fastening apparatus according to the invention with pneumatic cylinders.

FIG. 3 shows a perspective view of a portion of an exemplary third embodiment of the fastening apparatus 50″ according to the invention with the drive apparatus 9, formed here as a pneumatic drive 9b. Depicted once again are the holding system 4 with a part of the neck region 4a and the base plate 5, and also the NMR probe head 1 with the pedestal box 1a and a part of the probe head neck 1c.

The sensor elements 12, embodied once again as trailing contacts 12a, are attached to the upper side 1a' of the pedestal box 1a. Furthermore, the upper side 1a' of the pedestal box 1a has indentations 19 in the embodiment shown here, the indentations reaching into the pedestal box 1a, and with pneumatic channels (not depicted in any more detail) in the pedestal box 1a.

In the embodiment shown here, two pneumatic cylinders 20 are integrated into the base plate 5. The pneumatic cylinders 20 are each connected to an additional compressed air connector (not depicted in any more detail). This connector is typically designed for a load of approximately 3 bars. The pneumatic cylinders 20 are each connected to a pneumatic engagement means 20a. The pneumatic engagement means 20a enable an engagement in the indentations 19 of the NMR probe had 1.

To bring together the NMR probe head 1 and the base plate 5, the pneumatic engagement means 20a of the pneumatic cylinders 20 engage in the indentations 19 in the embodiment shown here. Compressed air is then applied to the pneumatic cylinders 20, as a result of which the NMR probe head 1 and the base plate 5 are pulled together in automated fashion and are aligned in the optimal position with the required contact pressure. Moreover, the pedestal box 1a of the NMR probe head 1 can be locked with the base plate 5 by way of the pneumatic engagement means 20a of the pneumatic cylinders 20 which engage in the indentations 19.

The various lines between the NMR probe head 1 and the base plate 5 are correctly interconnected without user intervention. Air is not consumed during the pulling together (i.e., the flow of the compressed air is zero). In this way, it is moreover possible to keep the force low when plugging together the NMR probe head 1 and the base plate 5.

In the embodiment shown here, the drive apparatus 9 is equipped with actuators (not depicted in any more detail). As a rule, these drive apparatuses are the actuators which convert the sensor signals into mechanical/pneumatic work, specifically so that the NMR probe head 1 is pulled against the base plate 5. If the NMR probe head 1 is introduced into the holding system 4 (and hence into the magnet system 2) and reaches the operational position, the actuator triggers a through-connection of the various feed lines and discharge lines. The through-connection between the NMR probe head 1 and the holding system 4 can be opened by the actuator again should the NMR probe head 1 be separated from the holding system 5, for example after an NMR measurement.

In this case, too, the sensor elements 12 are connected to the electronic control device 11 (likewise not depicted in any more detail). The electronic control device 11 allows the contact pressure between the upper side 1a' of the pedestal box 1a and the lower side 5' of the base plate 5 to be monitored by the sensor elements 12. The electronic control device 11 can adjust the contact pressure to a specifiable target value.

Furthermore, the electronic control device 11 can be designed so that said electronic control device 11 electrically checks the end position of the connecting elements and receiving elements. If the desired end position then is reached, the electronic control device 11 can transmit a signal to the drive apparatus 9 to stop the current drive procedure.

In the embodiment shown here, the two sensor elements 12 each comprise three trailing contacts 12a. The trailing contacts close one or more contacts (likewise not depicted in any more detail) when an end position of the NMR probe head 1 in the holding system 4 is reached in the translational direction (installation direction). When contact of the trailing contacts is established, the information from the trailing contacts that the end position has been reached is transmitted to the actuators. The actuators can then trigger a through-connection of the various feed lines and discharge lines. The trailing contacts 12a are distributed over the contact area between the upper side 1a' of the pedestal box 1a and the lower side 5' of the base plate 5. In this case, the distribution can ensure that all connections between the NMR probe head 1 and the holding system 4 are closed before the start of an NMR measurement.

To check the connections, the pressure in the pneumatic channels within the NMR probe head 1 can also be measured in addition to the electronic connection (e.g., current flow, resistance) in the embodiment shown here. This information can be transmitted to the control device 11 in order to provide the user with a warning notification so that an inadvertent operation of the NMR probe head 1 can be prevented in the case of a fault.

Figure 4A:
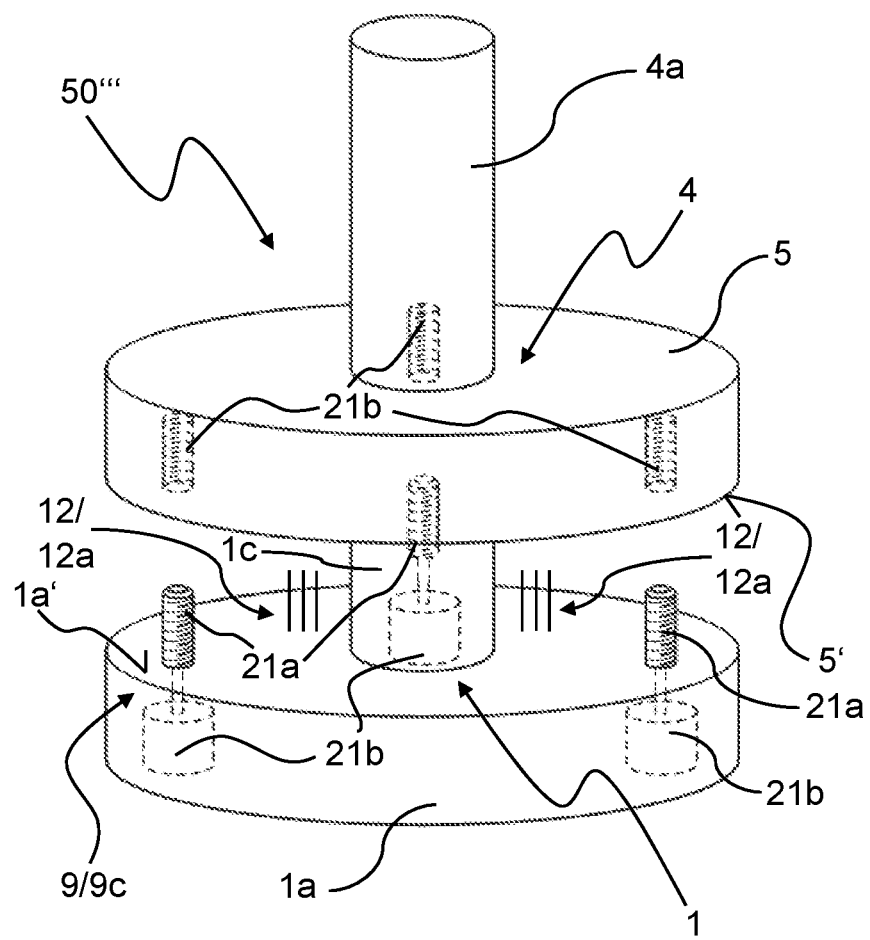
FIG. 4a shows a perspective view of a portion of an exemplary fourth embodiment of the fastening apparatus according to the invention with screwed connections.

FIG. 4a shows a perspective view of a portion of an exemplary fourth embodiment of the fastening apparatus 50‴ according to the invention with the drive apparatus 9, formed here as a screw drive 9c. Depicted anew are the holding system 4 with a part of the neck region 4a and the base plate 5, and also the NMR probe head 1 with the pedestal box 1a and a part of the probe head neck 1c.

The sensor elements 12 are attached to the upper side 1a' of the pedestal box 1a. Furthermore, the pedestal box 1a in the embodiment shown here comprises three screw motors 21, which are each connected to a screw 21a. The screws 21a are distributed uniformly on the upper side 1a' of the pedestal box 1a.

In the embodiment shown here, three screw holes 21b are integrated into the base plate 5. The screw holes 21b are exactly opposite the screws 21a and thus form a positioning system.

To bring together the NMR probe head 1 and the base plate 5, the NMR probe head 1 is inserted into the holding system 4 until the screws 21a engage in the screw holes 21b. The screw motor 21 can then be used to tighten the screws 21a in the screw holes 21b in uniformly perpendicular and automated fashion, and the NMR probe head 1 can be connected to the holding system 4 uniformly aligned. The various lines between the NMR probe head 1 and the base plate 5 are correctly interconnected without user intervention. In this way, it is possible to keep the force (from the user, in particular) low when plugging together the NMR probe head 1 and the base plate 5.

In this case, too, the sensor elements 12 are connected to the electronic control device in the NMR spectrometer console, with the function of the control device 11 in the embodiment shown here being substantially the same to that in the embodiment according to FIG. 3. Additionally, in the embodiment shown here, it is possible to provide a sensor system which detects the torque and transmits this information to the control device 11 in order to stop the individual screw motors 21 in the case of the desired contact pressure between the NMR probe head 1 and the base plate 5.

Figure 4B:
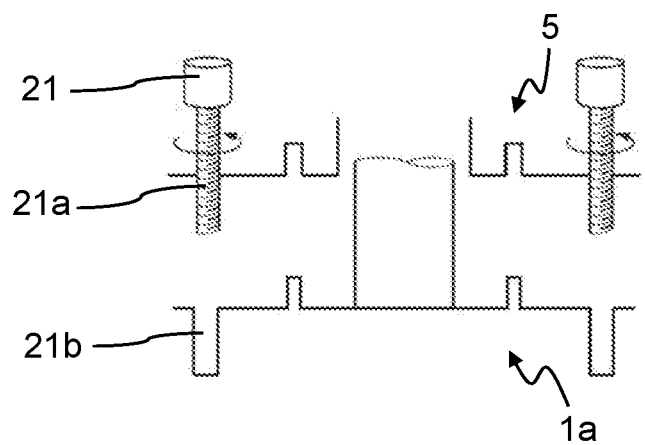

FIG. 4b shows a further, alternative embodiment of the screwed connections from FIG. 4a. Here, the screw motors 21 and the screws 21a are arranged in the base plate 5 indicated. The screw holes 21b are arranged in the pedestal box 1a. As a result, it is not necessary to lay additional electric connections between the pedestal box 1a and the base plate 5 for the screw motor 21.

In further embodiments not shown here, it is also possible to work without the screw motor 21 and to tighten the screws 21a in the screw holes 21b by hand.

Figure 5:
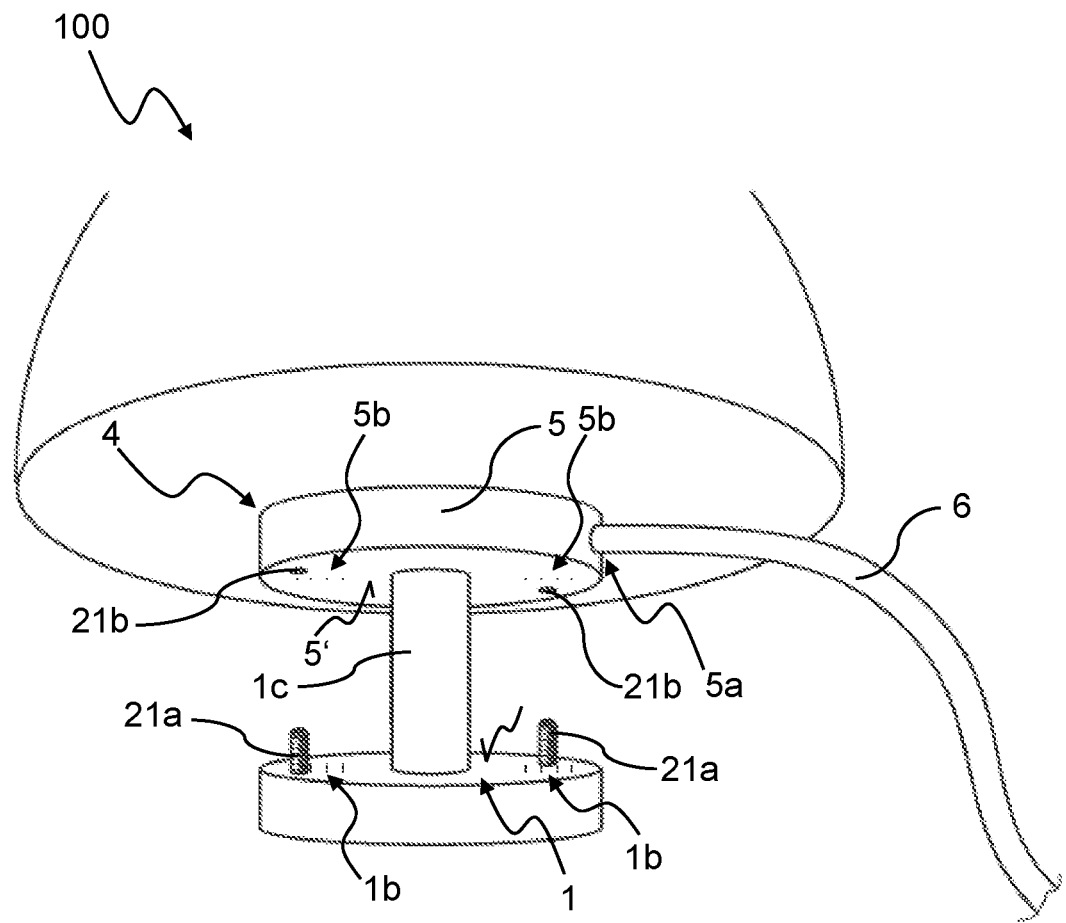
FIG. 5 shows a perspective view of the lower part of an NMR spectrometer with a partially inserted NMR probe head.

FIG. 5 shows a perspective view of a lower part of the NMR magnet system 2 with the partially inserted NMR probe head 1.

In this case, approximately half of the probe head neck 1c of the NMR probe head 1 is inserted into the holding system 4. A conductor bundle 6 with the various feed lines and discharge lines required for the operation of the NMR spectrometer 100 is guided in the base plate 5 of the holding system 4 via the receiving device 5a. Two screw holes 21b and two connecting elements 5b have been set into the lower side 5' of the base plate 5. On the upper side 1a' of the pedestal box 1a of the NMR probe head 1 two screws 21a are exactly opposite the two screw holes 21b and two receiving elements 1b are exactly opposite the two connecting elements 5b.

When the NMR probe head 1 and the holding system 4 are brought together further, it is possible to securely connect all lines required for the operation of the NMR spectrometer 100 in one step.

LIST OF REFERENCE SIGNS

1 NMR probe head
1a Pedestal box
1a' Upper side (of the pedestal box)
1b Receiving element
1b' Plug socket
1c Probe head neck
2 NMR magnet system
3 Room temperature tube (room temperature bore)
4 Holding system
4' Holding system bore
4a Neck region (of the holding system)
5 Base plate
5' Lower side (of the base plate)
5a Receiving device
5b Connecting element
5b' Plug
6 Conductor bundle
8 Positioning device
8a Alignment pin
8b Receiving recess
9 Drive apparatus
9a Radial drive
9b Pneumatic drive
9c Screw drive
10 Actuator, possibly identical to the drive apparatus
11 Electronic control device
12 Sensor element
12a Trailing contacts
13 Spring element
14 Engagement part
15 Shim system
16 Plug/socket pair
17 (Radially movable) insert part
18 Motor
18a Worm drive (connected to the motor)
19 Indentation
20 Pneumatic cylinder
20a Pneumatic engagement means
21 Screw motor
21a Screw
21b Screw hole
50, 50'-50''' Fastening apparatus
100 NMR spectrometer
101 NMR spectrometer console

The invention claimed is:

1. A fastening apparatus for detachably fastening an NMR probe head with a pedestal box to an NMR magnet system of an NMR spectrometer having a room temperature tube, the apparatus comprising:
a receiving device that receives electric, electronic, optical, pneumatic, and thermal feed lines required for operation of the NMR probe head; and
a holding system that is rigidly connected to the NMR magnet system during operation of the NMR spectrometer and that comprises a base plate to which the NMR probe head is detachably mechanically fastenable by way of the pedestal box, the base plate having a lower side in contact with an upper side of the pedestal box during the operation of the NMR spectrometer and a multiplicity of connecting elements into which said feed lines from the receiving device merge, wherein the pedestal box comprises receiving elements on its upper side into which the feed lines from the connecting elements merge in a relative assembled position defined for the operation of the NMR spectrometer the holding system and the NMR probe head.

2. The fastening apparatus as claimed in claim 1, wherein the connecting elements and the receiving elements are in the form of plug/socket pairs.

3. The fastening apparatus as claimed in claim 1, wherein the connecting elements and the receiving elements are configured such that, with the NMR probe head in its operational position within the NMR magnet system, the electric, electronic, mechanical, optical, pneumatic, and thermal feed lines are through-connected.

4. The fastening apparatus as claimed in claim 1, wherein the electric, electronic, optical, pneumatic, and thermal feed lines received by the receiving device of the base plate are guided from an NMR spectrometer console to the holding system via a single conductor bundle.

5. The fastening apparatus as claimed in claim 4, wherein the conductor bundle is surrounded by an external RF shield.

6. The fastening apparatus as claimed in claim 1 further comprising a positioning device that mechanically guides and/or aligns the NMR probe head into an operational position within the magnet system such that the receiving elements of the NMR probe head are directed to the connecting elements when the upper side of the pedestal box is brought into contact with the lower side of the base plate.

7. The fastening apparatus as claimed in claim 6, wherein the positioning device is configured to allow only one possible orientation of the NMR probe head in the NMR magnet system such that the NMR probe head cannot tilt within the NMR magnet system.

8. The fastening apparatus as claimed in claim 1 further comprising a drive apparatus that presses the upper side of the pedestal box against the lower side of the base plate.

9. The fastening apparatus as claimed in claim 8, wherein the drive apparatus comprises actuators that trigger a through-connection of the electric, electronic, optical, pneumatic, and thermal feed lines when the NMR probe head is introduced into its operational position within the magnet system and that open the through-connection when the NMR probe head is to be removed from the magnet system.

10. The fastening apparatus as claimed in claim 7, further comprising an electronic control device that monitors a contact pressure between the upper side of the pedestal box and the lower side of the base plate with sensor elements and that is configured to adjust said contact pressure to a specifiable target value.

11. The fastening apparatus as claimed in claim 10, wherein the electronic control device is configured to perform an electronic end position check of the connecting elements and/or of the receiving elements and to stop the drive apparatus when a desired end position is reached.

12. The fastening apparatus as claimed in claim 11, wherein the sensor elements comprise trailing contacts that transmit signals to the actuators when the desired end position has been reached the trailing contacts having a distribution across a contact area between the upper side of the pedestal box and the lower side of the base plate that ensures that all connections between the holding system and the NMR probe head are closed when said signals are transmitted.

13. The fastening apparatus as claimed in claim 10, wherein the electronic control device is further configured to output a warning notification to a user of the NMR spectrometer if the NMR probe head has not been correctly connected to the holding system.

14. The fastening apparatus as claimed in claim 1 further comprising a spring element arranged between the base plate of the holding system and the pedestal box of the NMR probe head, the spring element being relaxed in a first, open state and loaded in a second, closed state in such a way that the contact between the base plate (5) and pedestal box has no mechanical play.

15. The fastening apparatus as claimed in claim 1, further comprising a shim system for field-forming of a homogeneous magnetic field produced by the NMR magnet system.

16. An NMR spectrometer comprising an NMR spectrometer console and an NMR magnet system with a room temperature tube in which an NMR probe head with a pedestal box is detachably fastened, the NMR spectrometer further comprising a fastening apparatus as claimed in claim 1.

* * * * *